United States Patent [19]
Tantoush

[11] Patent Number: 5,969,950
[45] Date of Patent: Oct. 19, 1999

[54] ENHANCED HEAT SINK ATTACHMENT

[75] Inventor: Mohammed Tantoush, Union City, Calif.

[73] Assignee: Sun Microsystems, Inc., Mountain View, Calif.

[21] Appl. No.: 09/186,269

[22] Filed: Nov. 4, 1998

[51] Int. Cl.⁶ ...................................................... H05K 7/20
[52] U.S. Cl. .......................... 361/704; 361/719; 257/719; 174/52.4; 165/80.3
[58] Field of Search ..................................... 361/687–697, 361/702–719, 690, 735, 741, 752, 756, 760, 764, 767, 768, 784–790; 257/707–720, 659, 726, 722; 165/80.3, 80.4, 185; 174/16.3, 52.4, 254, 252; 439/66; 24/297

[56] References Cited

U.S. PATENT DOCUMENTS

| | | | |
|---|---|---|---|
| 5,455,457 | 10/1995 | Kurokawa | 257/712 |
| 5,473,510 | 12/1995 | Dozier | 361/719 |
| 5,567,986 | 10/1996 | Ishida | 257/707 |
| 5,621,615 | 4/1997 | Dawson et al. | 361/704 |
| 5,734,554 | 3/1998 | Mitty et al. | 361/697 |
| 5,901,039 | 5/1999 | Dehaine et al. | 361/704 |

*Primary Examiner*—Leo P. Picard
*Assistant Examiner*—Michael Datskovsky
*Attorney, Agent, or Firm*—Julian Caplan; Flehr Hohbach Test Albritton & Herbert LLP

[57] ABSTRACT

A slug or plate of copper or some other material having high heat conductivity is attached by an adhesive such as epoxy to a heat-emitting electrical component such as a chip, ASIC, microprocessor, or the like. A heat sink having a base and a plurality of fins upstanding from the base is attached to the slug or plate by screws, nuts or other, preferably detachable, means. The bottom of the base may be formed with a socket to receive the slug. The heat sink may be larger than the slug, thereby improving heat dissipation. When it is necessary to replace the component, the heat sink is detached from the slug and re-used.

5 Claims, 4 Drawing Sheets

ENHANCED HEAT SINK ATTACHMENT

BACKGROUND OF THE INVENTION

1. Field of the Invention

This invention relates to a new and improved enhanced heat sink. More particularly the invention relates to a thermally enhanced and scalable heat sink to dissipate heat from an electrical component.

2. Description of Related Art

The use of heat sinks to dissipate heat from electrical components is well known in the art. Permanent attachment of heat sinks to such components may require disposal of the heat sink as well as the component when the latter has to be replaced or accessed. The present invention attaches (preferably permanently) to the component a slug or plate of a heat conductive material. The heat sink is then detachably connected to the slug or plate. When the component must be replaced, the slug or plate may be discarded with the component but the heat sink may be reused, thereby differing from prior constructions.

SUMMARY OF THE INVENTION

A slug or plate of highly heat conductive material (such as copper) is permanently adhered to an electrical component such as a chip, ASIC, microprocessor or the like which emits relatively large amounts of heat. Heretofore heat sinks have been adhered to such components and when the component must be discarded the heat sink is likewise discarded. However, in accordance with the present invention, a slug or plate of copper or other material having high heat transference is mounted upon the component and acts as a heat spreader. A conventional heat sink (usually formed of aluminum) is attached to the copper slug, preferably in a removable manner. Thus the heat sink may be made as large or small as is needed in order to dissipate the heat emitted from the component.

Accordingly the present invention provides an alternate means for attaching heat sinks onto components with improved interface thermal resistance, without the loss of heat transfer efficiency.

A slug or thin plate of high thermal conductivity metal (copper or synthetic diamond or other suitable material) is attached to the component by epoxy cement or other suitable means. Preferably the slug or plate is thin—i.e. approximately 1–2 mm in thickness—and the length and width thereof conforms to the footprint of the component or may be made larger or smaller than the footprint if circumstances require. In one form of the invention several tapped holes are formed in the slug, the number and location depending upon the size of the slug and the size of the chip. The location of the holes is subject to variation, but preferably the holes are located close to the corners of the plate and there may be one or more additional holes near the center of the plate in order to conform the slug to the contour of the component. A heat sink is then attached to the slug or plate, preferably by counterboring holes in the base of the heat sink to receive screws. It will be understood that the heat sink may be attached to the slug prior to the attachment of the slug to the component.

In another form of the invention, studs project upward from the slug above the height of the heat sink fins. Nuts threaded onto the studs bear against the distal ends of the fins.

Forming an entire heat sink of copper is not usually recommended because of the weight and cost thereof, despite the fact that its superior thermal conductivity is acknowledged. By using a very thin plate, the weight burden and cost may be reduced, but the thermal advantage utilized.

If it is necessary to use a larger heat sink on the same component, the existing heat sink may be replaced and a new heat sink may be attached to the slug. It is possible to test, rework and scan the component without any interference from the heat sink.

Alignment of the heat sink on the component is also improved if a pocket is formed in the bottom of the base of the heat sink to receive the slug. Machining of the bottom of the base of the heat sink makes it possible that side lips are able to extend beyond the height of the component. Alternatively, a pocket to fit the component may be formed on the underside of the slug.

Reduction in the overall heat sink size (i.e. length, width and height) is possible in accordance with the present invention. In many conditions, size is the limiting factor in implementing the required cooling for components.

Additionally it is possible to have a slug or plate of various sizes so that the interface surface area between the component and the slug, and the slug and the heat sink, may be designed for optimum results.

Heat transfer efficiency, high thermal conductivity, greater surface area of heat transfer, complete surface contact between the various components of the invention and implementation flexibility are major objectives of the present invention.

Other features and advantages of the invention will appear from the following description in which the preferred embodiments have been set forth in detail, in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Figure 1:
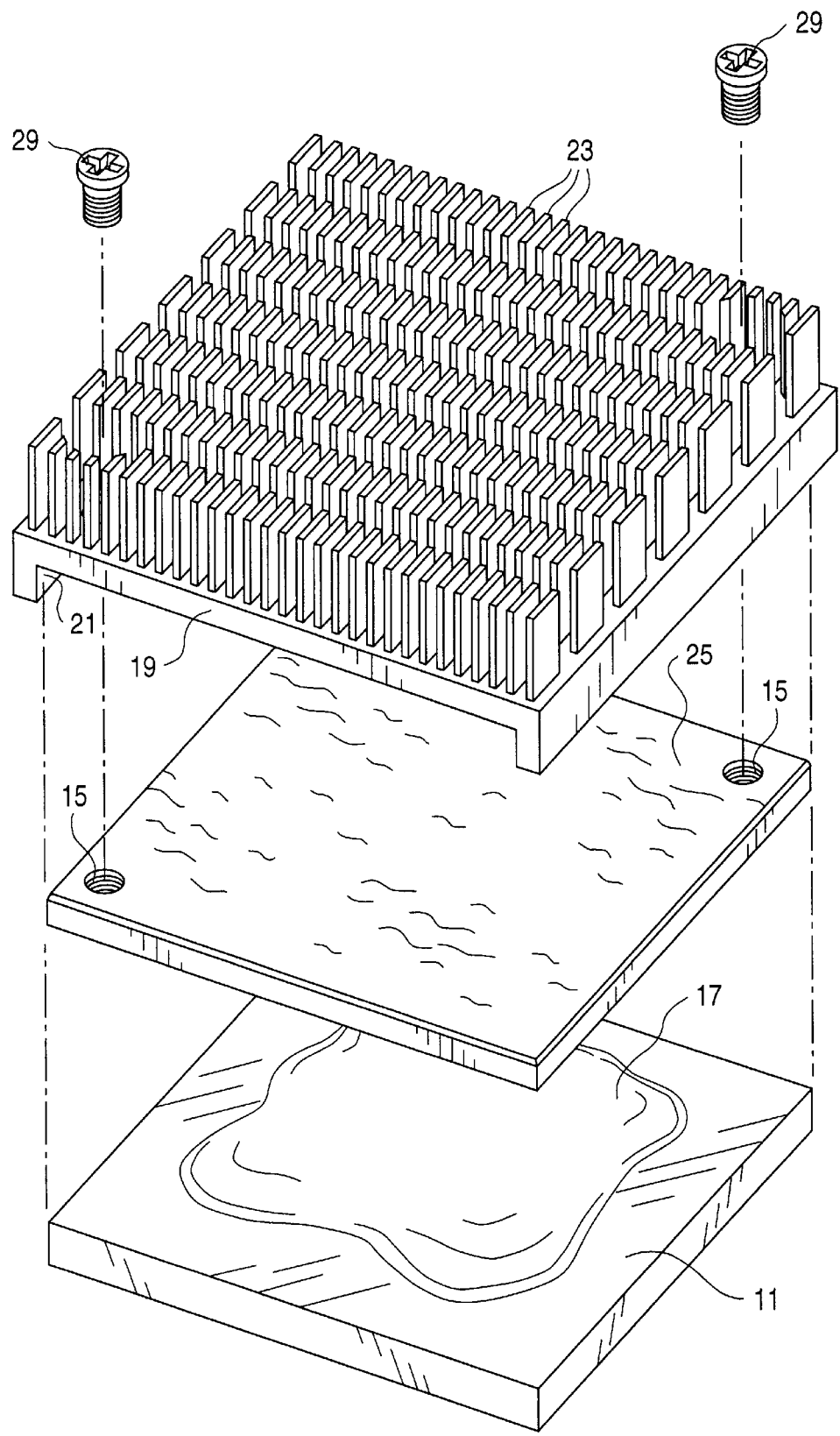
FIG. 1 is an exploded perspective view of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Component 11 is shown schematically in the accompanying drawings and may be of any desired shape. Typically a chip 40 mm×40 mm may be used. Other heat emitting components may be substituted. Slug 13 may be dimensioned the same as component 11 or may be larger or smaller, depending upon heat dissipation requirements. Typically a copper plate 1–2 mm in thickness is suitable. Tapped holes 15 having fine threads are formed at the corners and other locations in slug 13. Slug 13 is attached to the component 11 by epoxy cement 17 or other means.

A heat sink of slightly modified conventional structure may be used with the present invention, preferably formed of aluminum. Typically the heat sink may be 46×46 mm, but it may be as large as desired without changing the size of slug 13. A pocket 21 may be cut in the bottom of base 19 the same size or larger than slug 13 and it may be deeper than the height of the slug. The pocket 21 is preferably used to line up the heat sink. Fins 23 project up from the base 19 to dissipate heat into the surrounding atmosphere. The shape of fins shown in FIGS. 1–4 us optional. Square fins as shown in FIG. 5 or other shapes may be substituted. Preferably thermal grease 25 is applied between slug 13 and base 19 for heat transference between the components.

Holes 27, preferably counterbored, are formed in base 19 and fins 23 are cut away above the hole 27 so that screws 29 may be inserted through the holes 27 and threaded into the tapped holes 15 to secure the base 19 to the slug 13. When desired, the screws 29 may be removed, providing access to the component 11 under the slug 13.

Figure 4:
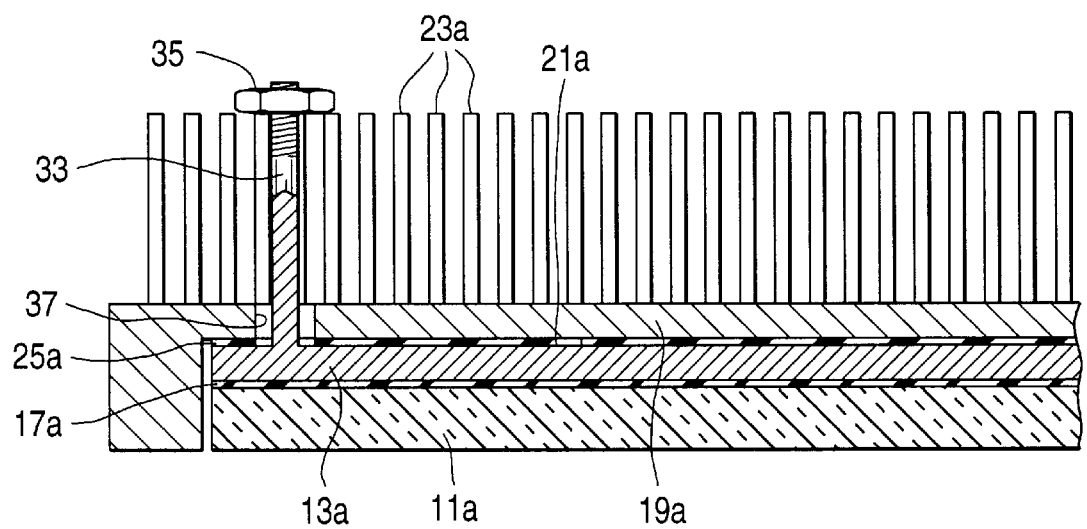
FIG. 4 is a view similar to FIG. 3 of a modification.
Figure 5:
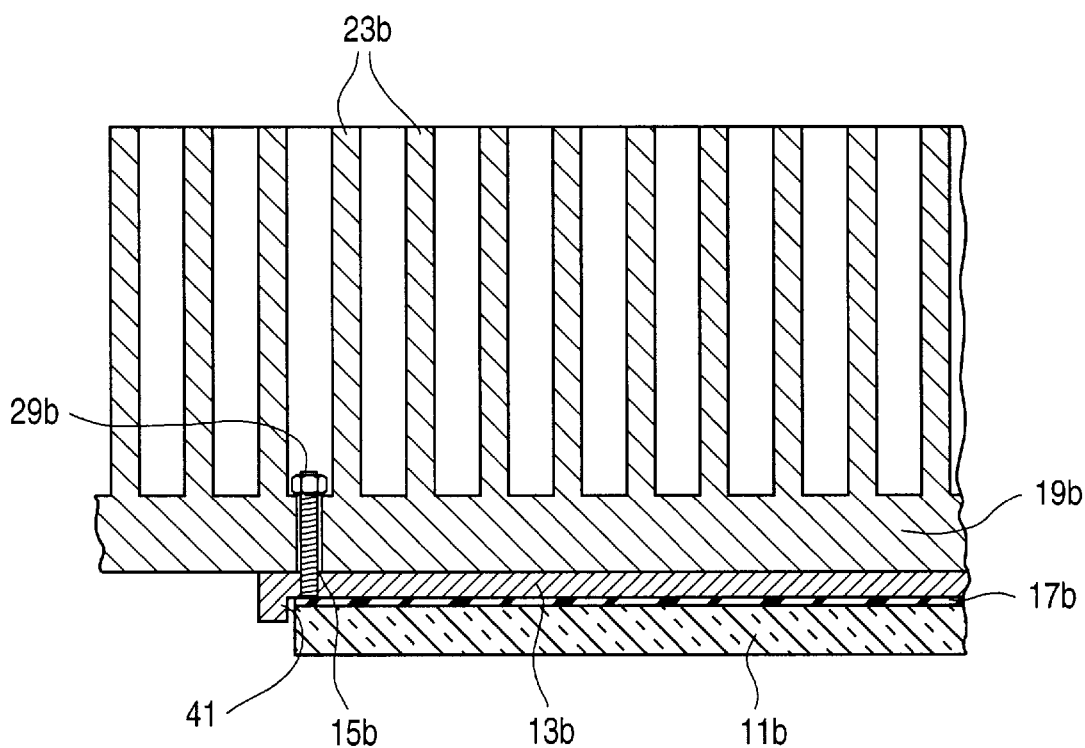
FIG. 5 is a view similar to FIG. 3 of another modification.

An alternate way of attaching the heat sink base 19a to the slug 13a is shown in FIG. 4. In this modification, studs 33 may be formed integrally with slug 13a or may be attached thereto in various ways. A hole 37 is formed in base 19a to receive stud 33. The upper end of stud 33 is threaded to receive nut 35 which bears against the tops of fins 23a which surround stud 33.

In FIG. 5, heat sink base 19b is shown larger than slug 13b, an installation which may be desirable when space permits and heat dissipation requires. In such an installation, a pocket 41 may be formed on the underside of slug 13b to align the slug with component 11b. The fins 23b may be square in cross-section rather than the thin, rectangular fins of the previous modifications.

Figure 2:
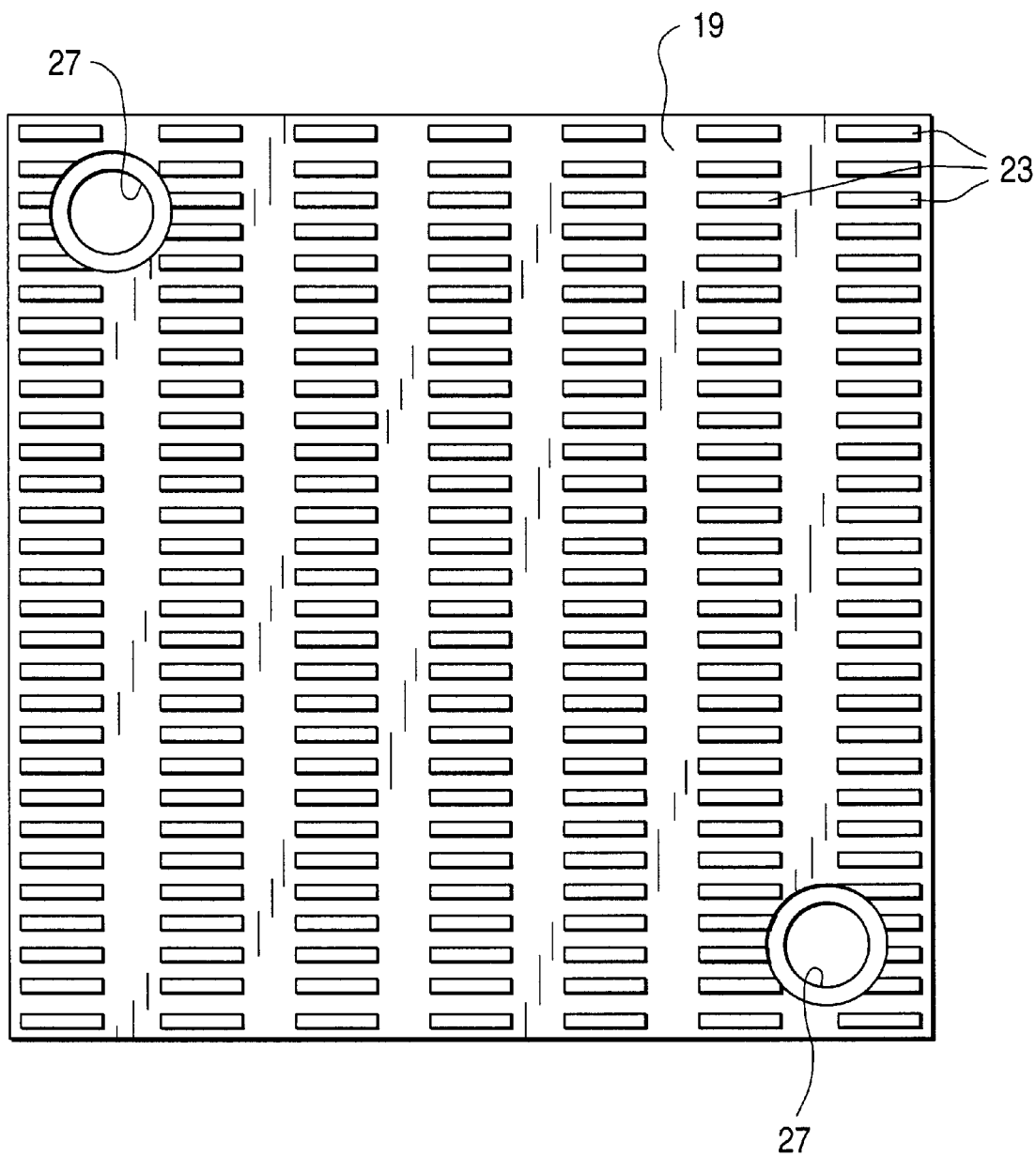
FIG. 2 is a top plan view of the heat sink of the present invention.
Figure 3:
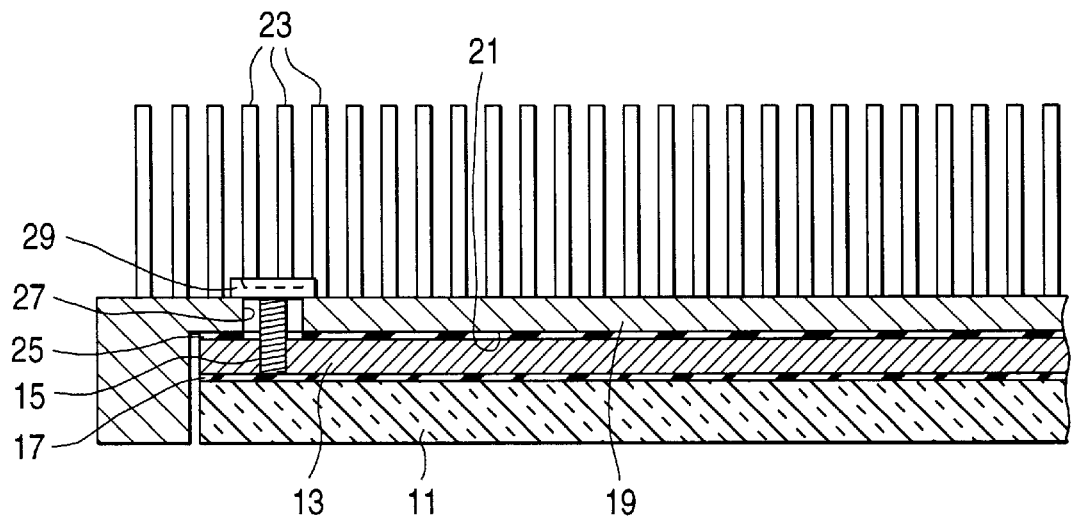
FIG. 3 is a fragmentary vertical section through the components.

In other respects the structured of FIGS. 4 and 5 resembles those of FIGS. 1–3 and the same reference numerals, followed by the subscripts $a$ and $b$ respectively, are used to designate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A heat dissipating device comprising an electronic heat-emitting component, a thin member of high heat transferring material shaped for intimate heat transference when positioned contacting said component, said member having substantially the same width and length as said component, an adhesive adhering said member to said component, a heat sink having a base having a first surface, said first surface having a plurality of heat dissipating fins projecting therefrom, a second surface of said base being shaped for intimate heat transference to said member, said second surface being formed with a pocket for said member and for said component, said pocket being at least as large in width and length as said member, and at least one detachable screw fastener connecting said heat sink to said member.

2. A device according to claim 1 in which said adhesive comprises an epoxy cement.

3. A device according to claim 1 which further comprises thermal grease between said second surface and said member.

4. A device according to claim 1 in which said fastener comprises a first hole in said member and a bolt passing through a second hole in said base, one of said holes being tapped, some of said fins adjacent said second hole being cut away to permit entry of said bolt into said hole, said second hole being located adjacent a margin of said base.

5. A device according to claim 1 in which said fastener comprises a stud on said member, said heat sink being formed with a hole to receive said stud and a nut engaging said stud, said stud extending above said fins, said nut bearing against distal ends of at least one of said fins.

* * * * *